(12) United States Patent
Wang et al.

(10) Patent No.: US 11,805,671 B2
(45) Date of Patent: Oct. 31, 2023

(54) METHOD FOR MANUFACTURING DISPLAY BACKPLANE, DISPLAY BACKPLANE, AND DISPLAY DEVICE

(71) Applicant: BOE Technology Group Co., Ltd., Beijing (CN)

(72) Inventors: Jing Wang, Beijing (CN); Hongwei Tian, Beijing (CN); Ming Liu, Beijing (CN); Ziang Han, Beijing (CN); Zunqing Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 210 days.

(21) Appl. No.: 17/356,380

(22) Filed: Jun. 23, 2021

(65) Prior Publication Data
US 2022/0102690 A1   Mar. 31, 2022

(30) Foreign Application Priority Data
Sep. 28, 2020   (CN) .......................... 202011045024.0

(51) Int. Cl.
*H10K 50/844*   (2023.01)
*H10K 71/00*   (2023.01)
*H10K 77/10*   (2023.01)

(52) U.S. Cl.
CPC .......... *H10K 50/844* (2023.02); *H10K 71/00* (2023.02); *H10K 77/10* (2023.02)

(58) Field of Classification Search
CPC ..... H10K 59/121; H10K 50/8428; G09F 8/33
See application file for complete search history.

(56) References Cited

U.S. PATENT DOCUMENTS

| 2006/0024444 A1* | 2/2006 | Brody ................... C23C 14/562 |
| | | 118/504 |
| 2017/0229531 A1* | 8/2017 | Shi ....................... H10K 50/828 |

* cited by examiner

*Primary Examiner* — Michael Jung
(74) *Attorney, Agent, or Firm* — IPRO, PLLC

(57) ABSTRACT

A method for manufacturing a display backplane, a display backplate, and a display device are disclosed. The method includes: forming a planarization layer on one side of a substrate inside a pixel region, a partition region, and a perforation region; forming at least one girdle of annular passivation layer disposed around the perforation region on a surface, away from the substrate, of the planarization layer inside a portion of the partition layer; removing a portion of the planarization layer, inside the partition region, uncovered by the annular passivation layer and the planarization layer, inside the partition region, partially covered by the annular passivation layer, to obtain at least one girdle of annular isolation columns disposed between the substrate and the annular passivation layer and around the perforation region; and forming organic light-emitting elements on one side of the planarization layer away from the substrate to obtain the display backplane.

14 Claims, 4 Drawing Sheets

METHOD FOR MANUFACTURING DISPLAY BACKPLANE, DISPLAY BACKPLANE, AND DISPLAY DEVICE

CROSS REFERENCE TO RELATED APPLICATION

The application claims priority to Chinese Patent Application No. 202011045024.0, filed on Sep. 28, 2020 and entitled "METHOD FOR MANUFACTURING DISPLAY BACKPLANE, DISPLAY BACKPLANE, AND DISPLAY DEVICE", the content of which is incorporated herein by reference in its entirety.

TECHNICAL FIELD

The present disclosure relates to the field of display technologies and, in particular, relates to a method for manufacturing a display backplane, the display backplane, and a display device.

BACKGROUND

In recent years, more and more organic light-emitting diode (OLED) displays have emerged in the market and have been widely applied to display devices such as cell phones and tablet computers. Moreover, with the advances in science and technology, people have shown increasingly high demands on the visual experience of display technologies, where the screen-to-body ratio of the display device has become particularly important. In display technologies, perforated screens are novel display screens which are taking the place of notch screens and water drop screens to achieve a higher screen-to-body ratio for OLEDs. Compared with special-shaped screens such as notch screens and water drop screens, perforated screens are further improved in the screen-to-body ratio and also more attractive in appearance.

SUMMARY

In an aspect, the present disclosure provides a method for manufacturing a display backplane, the display backplane is divided into a pixel region, a partition region and a perforation region; the partition region is disposed around the perforation region; the pixel region is disposed around the partition region, the method comprises:
  forming a planarization layer on one side of a substrate inside the pixel region, the partition region, and the perforation region;
  forming at least one girdle of annular passivation layer disposed around the perforation region on a surface, away from the substrate, of the planarization layer inside a portion of the partition layer;
  removing a portion of the planarization layer, inside the partition region, uncovered by the annular passivation layer and the planarization layer, inside the partition region, partially covered by the annular passivation layer, to obtain at least one girdle of annular isolation columns disposed between the substrate and the annular passivation layer and around the perforation region; and
  forming organic light-emitting elements on one side of the planarization layer away from the substrate to obtain the display backplane.
according to an embodiment of the present disclosure, orthographic projections of the annular isolation columns on the substrate are disposed in a range of an orthographic projection of the annular passivation layer on the substrate.
according to an embodiment of the present disclosure, an orthographic projection of the planarization layer, disposed in the perforation region, on the substrate overlaps an orthographic projection of the perforation region on the substrate.
according to an embodiment of the present disclosure, wherein after forming the planarization layer on one side of the substrate inside the pixel region, the partition region and the perforation region, the method further comprises:
forming a plurality of passivation layers on a surface of the planarization layer, inside the perforation region, away from the substrate; and when the annular isolation columns are obtained, removing a portion of the planarization layer, inside the perforation region, uncovered by the passivation layer and the planarization layer, inside the perforation region, partially covered by the passivation layer, to form a plurality of film sub-layers between the substrate and the passivation layer.
according to an embodiment of the present disclosure, the plurality of film sub-layers is strip-shaped, and include a plurality of first film sub-layers spaced apart from each other; and the plurality of first film sub-layers extend along a first direction.
according to an embodiment of the present disclosure, the plurality of film sub-layers further comprises a plurality of second film sub-layers, which extend along a second direction different from the first direction; and the plurality of second film sub-layers are disposed spaced apart in the first direction, and disposed between every two adjacent first film sub-layers.
according to an embodiment of the present disclosure, the height of the at least one girdle of annular isolation columns inside the partition region is different than the height of the film sub-layers inside the perforation region.
according to an embodiment of the present disclosure, the height of the annular isolation columns close to the edges of the perforation region is lower than the height of the film sub-layers inside the perforation region.
according to an embodiment of the present disclosure, forming the organic light-emitting elements on one side of the planarization layer away from the substrate comprises:
forming a preformed film layer on one side of the planarization layer away from the substrate;
coating photoresist on a surface of the preformed film layer away from the substrate;
baking, exposing, and developing the photoresist in sequence; and
etching the preformed layer.
according to an embodiment of the present disclosure, the planarization layer is formed through processes of evaporating, depositing, or ink-jet printing.
according to an embodiment of the present disclosure, said removing the portion of the planarization layer, inside the partition region, uncovered by the annular passivation layer and the planarization layer, inside the partition region, partially covered by the annular passivation layer comprises:
etching to remove the portion of the planarization layer, inside the partition region, uncovered by the annular passivation layer and the planarization layer, inside the partition region, partially covered by the annular passivation layer.

according to an embodiment of the present disclosure, further comprising:

integrally encapsulating the display backplane; and perforating the perforation region.

In another aspect, the present disclosure provides a display backplane, the display backplane is divided into a pixel region, a partition region, and a perforation region; the partition region is disposed around the perforation region; the pixel region is disposed around the partition region; and the display backplane comprises:

a substrate;

a planarization layer, which is disposed on one side of the substrate and within the pixel region;

at least two girdles of annular isolation columns, which are disposed on one side of the substrate, located within the partition region and around the perforation region and disposed on the same layer as the planarization layer;

at least two girdles of annular passivation layers, which are disposed on surfaces of the annular isolation columns away from the substrate, located at partial regions inside the partition region and disposed around the perforation region; and organic light-emitting elements, which are disposed on one side of the planarization layer away from the substrate.

according to an embodiment of the present disclosure, the height of the annular isolation columns close to edges of the perforation region is lower than the height of the annular isolation columns close to the edges of the pixel region.

In another aspect, the present disclosure provides a display device, comprising a display panel manufactured using the above method.

The description above only provides an overview of the technical solutions of the present disclosure. The following enumerates specific embodiments of the present disclosure for a clearer understanding of the technical means of the present disclosure so as to practice it in accordance with the specifications, and for a clearer understanding of the above and other objects, features, and advantages of the present disclosure.

BRIEF DESCRIPTION OF THE DRAWINGS

For clearer descriptions of the technical solutions in the embodiments of the present disclosure and in the related art, the following briefly introduces the accompanying drawings required for describing the embodiments or the related art. Apparently, the accompanying drawings in the following description show some embodiments of the present disclosure, and a person of ordinary skill in the art may still derive other drawings from these accompanying drawings without creative efforts.

DETAILED DESCRIPTION

Embodiments of the present disclosure will be described in detail below. The embodiments described below are for exemplary purposes and are only intended to explain the present disclosure, and cannot be understood as limiting the present disclosure. The embodiments in which specific techniques or conditions are not clearly indicated should be carried out according to the techniques or conditions described in the literature in the art or according to the product specifications.

The present disclosure is completed by the inventor based on the following findings:

based on extensive in-depth investigations and experimental verifications, the inventor found that the reason for the above technical problems of the OLED display devices in the related art lied in that: in the related art, the display backplane was encapsulated only in an isolation region but not in a perforation region which was between encapsulation structures disposed therearound; therefore, when a film layer (for example, an organic light-emitting element) was formed subsequently, bubbles were included in the perforation region (for example, during the coating of photoresist, the bubbles were easily included in the perforation region), and then partitioned in places close to the edges of the perforation region by the encapsulation structures; as a result, when the ambient temperature rises, a film rupture in the above would be caused.

In light of this, the present disclosure is intended to at least solve one of the technical problems in the related art to a certain extent. To this end, an objective of the present disclosure is to provide a method for manufacturing a display backplane, where film rupture does not occur easily in the manufacturing process, and the manufactured display backplane has a separation region capable of effectively preventing water and oxygen invasion from the outside and shows a good encapsulation effect.

According to an aspect of the present disclosure, the present disclosure provides a method for manufacturing a display backplane. According to the embodiment of the present disclosure, referring to FIG. 1, the display backplane 10 is divided into a pixel region A, a partition region B, and a perforation region C, wherein the partition region B is disposed around the perforation region C, and the pixel region A is disposed around the partition region B. Referring to FIGS. 2, 3, 4 and 5, the method may include the following steps.

Figure 1:
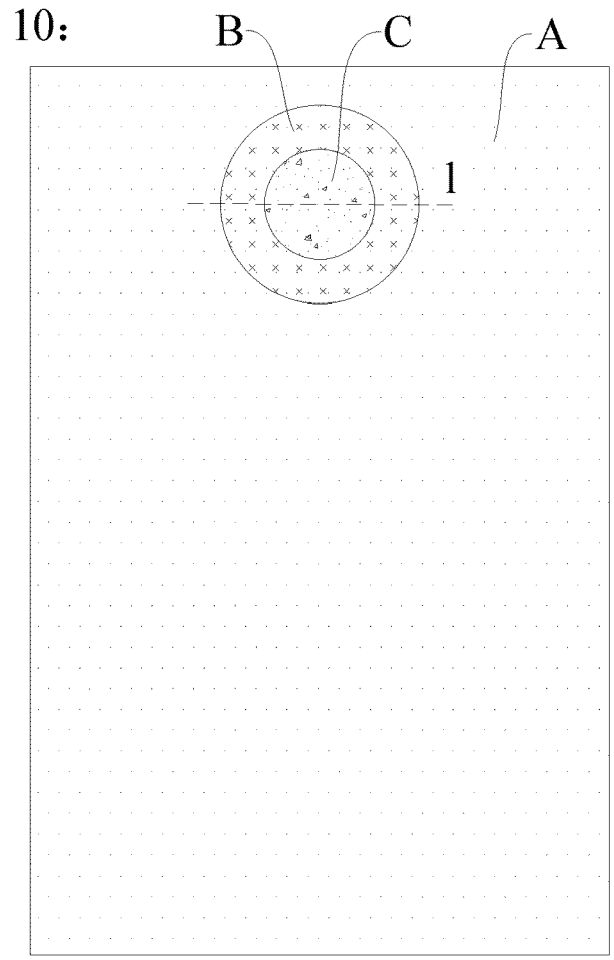
FIG. 1 illustrates a schematic diagram of a planar structure of a display backplane according to an embodiment of the present disclosure.
Figure 2:
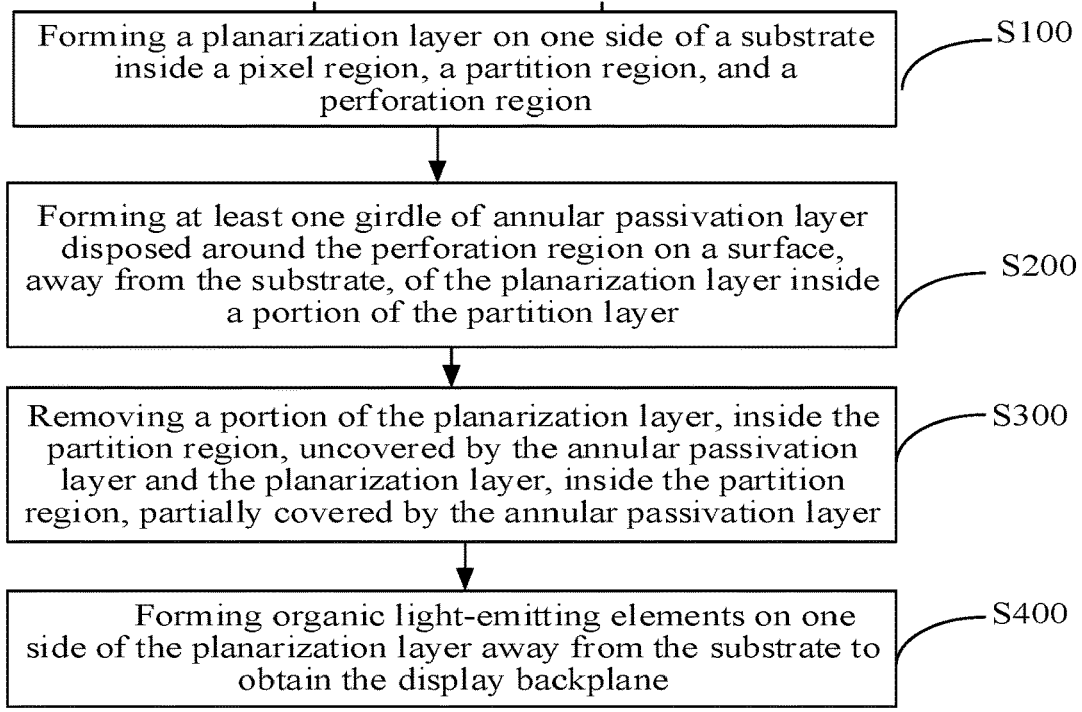
FIG. 2 illustrates a schematic flowchart of a method for manufacturing a display backplane according to an embodiment.
Figure 3:
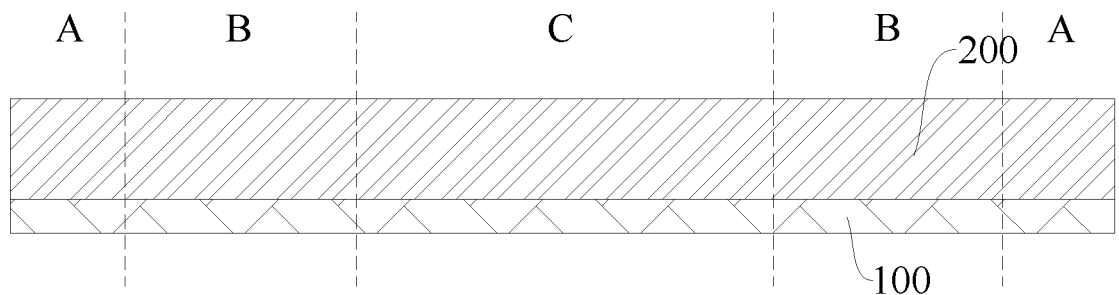
FIG. 3 illustrates a schematic diagram of a sectional structure during the process of manufacturing a display backplane according to an embodiment of the present disclosure.

In S100, a planarization layer 200 is formed on one side of a substrate 100 inside the pixel region A, the partition region B, and the perforation region C (refer to FIG. 3 for the schematic structural diagram, and it should be noted that the sectional diagrams illustrated herein are all a section of the display backplane 10 at a line 1 as illustrated in FIG. 1, which will not be repeated hereinafter).

According to the embodiment of the present disclosure, in this step, the planarization layer 200 is also formed on one side of the substrate 100 inside the perforation region C to play a role of occupation, therefore, bubbles are less likely to be included in the perforation region even during the subsequent formation of film layers, since the planarization layer is present in the perforation region; and the technical problem where the above-mentioned bubbles are isolated to places close to the edges of the perforation region is solved. As a result, even in the subsequent process procedures in which the ambient temperature rises (for example, during baking), film rupture does not occur easily; and the partition region of the manufactured display backplane may effectively prevent water and oxygen invasion from the outside to achieve a good encapsulation effect.

According to the embodiment of the present disclosure, the specific process of forming the planarization layer 200 on one side of the substrate 100 inside the pixel region A, the partition region B, and the perforation region C is not particularly limited, and may include, for example, evaporating, depositing, or ink-jet printing; and its specific process conditions and parameters may be flexibly selected by those skilled in the art according to actual needs, the details of which will not be repeated herein. As such, the process is simple and convenient to operate and easy to implement for industrial production.

According to the embodiment of the present disclosure, further, an orthographic projection of the planarization layer 200, disposed in the perforation region, on the substrate 100 overlaps an orthographic projection of the perforation region C on the substrate 100. As such, since the whole planarization layer has existed in the perforation region, the bubbles will not be included in the perforation region at all, thereby completely preventing any film rupture in the subsequent process procedures. Moreover, the partition region of the manufactured display backplane may further effectively prevent water and oxygen invasion from the outside to further improve the encapsulation effect.

Figure 4:
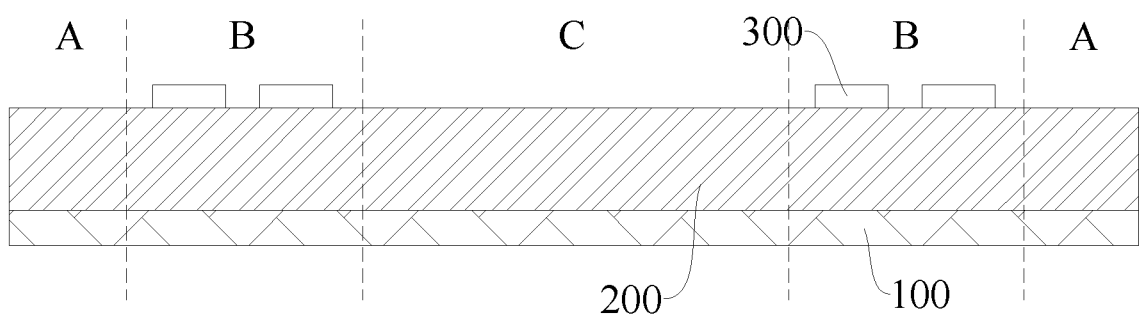
FIG. 4 illustrates a schematic diagram of another sectional structure during the process of manufacturing a display backplane according to an embodiment of the present disclosure.

In S200, at least one girdle of annular passivation layer 300 surrounding the perforation region C is formed on a surface, away from the substrate 100, of the planarization layer 200 inside a portion of the partition layer B (refer to FIG. 4 for the schematic structural diagram, and it should be noted that the explanation is made by taking more than two girdles of annular passivation layers 300 as an example in the drawings herein, however, those skilled in the art may also understand that only one or more girdles of annular passivation layers 300 may be also formed, which will not be repeated hereinafter).

According to the embodiment of the present disclosure, the specific process of forming at least one girdle of annular passivation layer 300 surrounding the perforation region C on the surface, away from the substrate 100, of the planarization layer 200 inside the portion of the partition layer B is not particularly limited, and may include processes such as evaporating or depositing; and its specific process conditions and parameters may be flexibly selected by those skilled in the art according to actual needs, the details of which will not be repeated herein. As such, the process is simple and convenient to operate and easy to implement for industrial production.

Figure 5:
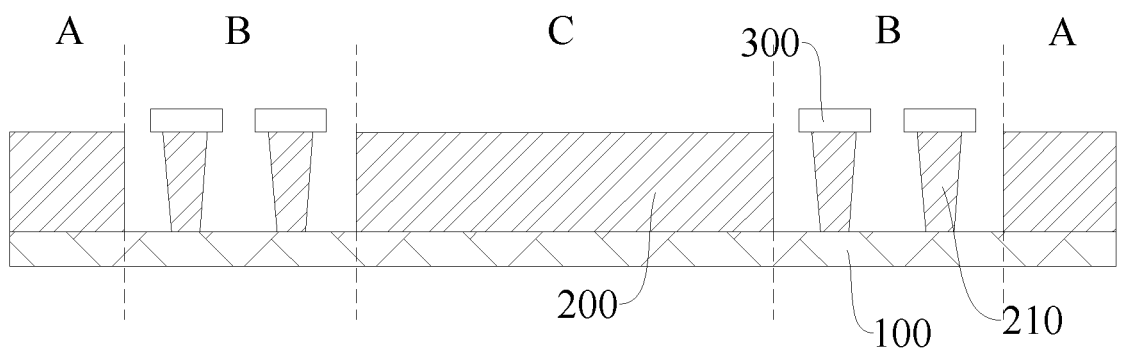
FIG. 5 illustrates a schematic diagram of still another sectional structure during the process of manufacturing a display backplane according to an embodiment of the present disclosure.

In S300, a portion of the planarization layer, inside the partition region B, uncovered by the annular passivation layer 200 and the planarization layer, inside the partition region B, partially covered by the annular passivation layer is removed to obtain at least one girdle of annular isolation columns 210 disposed between the substrate 100 and the annular passivation layer 300 and around the perforation region C (refer to FIG. 5 for the schematic structural diagram).

According to the embodiment of the present disclosure, the specific process of removing the portion of the planarization layer, inside the partition region B, uncovered by the annular passivation layer 200 and the planarization layer, inside the partition region B, partially covered by the annular passivation layer is not particularly limited, and may include, for example, etching; and its specific process conditions and parameters may be flexibly selected by those skilled in the art according to actual needs, the details of which will not be repeated herein. As such, the process is simple and convenient to operate and easy to implement for industrial production. Moreover, at least one girdle of annular isolation columns 210 disposed between the substrate 100 and the annular passivation layer 300 and around the perforation region C may be effectively manufactured, thereby playing a better role of encapsulating the perforation region of the display backplane.

According to the embodiment of the present disclosure, further, orthographic projections of the annular isolation columns 210 on the substrate 100 are disposed in a range of an orthographic projection of the annular passivation layer 200 on the substrate. As such, the annular isolation columns 210 with a simple structure described above may play a better role encapsulating the perforation region of the display backplane.

In S400, organic light-emitting elements are formed on one side of the planarization layer away from the substrate to obtain the display backplane (not illustrated in the figure).

According to an embodiment of the present disclosure, the specific process of forming the organic light-emitting elements on one side of the planarization layer away from the substrate is not particularly limited, and for example, may specifically include the following sub-steps:

In S410, a preformed film layer is formed on one side of the planarization layer away from the substrate.

In S420, a photoresist is coated on a surface of the preformed film layer away from the substrate.

In S430, baking, exposing, and developing are performed on the photoresist in sequence.

In S440, the preformed layer is etched.

According to the embodiment of the present disclosure, the specific processes of forming the preformed film layer, coating the photoresist, baking, exposing and developing, as well as etching are not particularly limited; and their specific process conditions and parameters may be flexibly selected by those skilled in the art according to actual needs, the details of which will not be repeated herein. As such, the processes are simple and convenient to operate and easy to implement for industrial production. Moreover, components, such as a pixel-defining layer and a light-emitting layer, in the organic light-emitting elements of the display backplane may be effectively manufactured, the details of which will not be repeated herein.

According to the embodiment of the present disclosure, in the above S100, the planarization layer 200 is also formed on one side of the substrate 100 inside the perforation region C to play a role of occupation, therefore, bubbles are less likely to be included in the perforation region even during the subsequent formation of film layers, since the planarization layer is present in the perforation region. Therefore, in this step, in particular during the baking in S430, a film rupture will not occur easily; and the partition region of the manufactured display backplane may effectively prevent water and oxygen invasion from the outside to achieve a good encapsulation effect.

Figure 6:
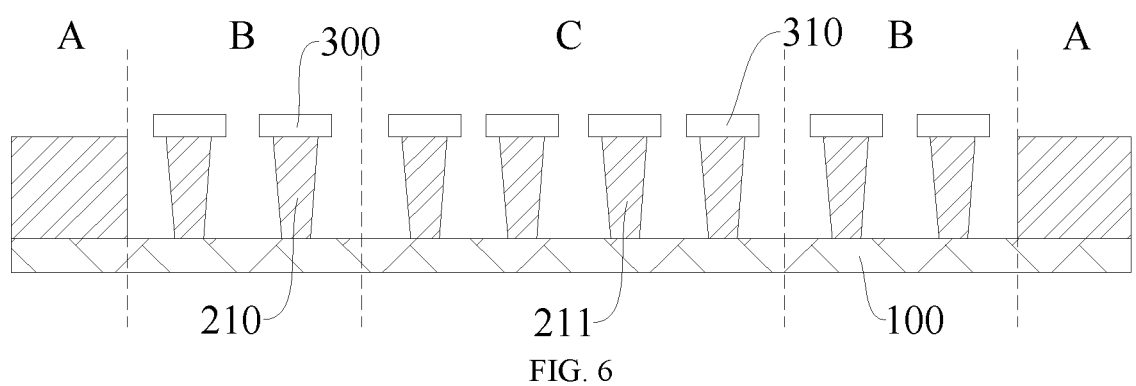
FIG. 6 illustrates a schematic diagram of a sectional structure of a film sub-layer according to an embodiment of the present disclosure.

According to the embodiment of the present disclosure, those skilled in the art may understand that in the above S200, i.e., in the step of forming at least one girdle of annular passivation layer 300 surrounding the perforation region C on the surface, away from the substrate 100, of the planarization layer 200 inside the portion of the partition layer B, a plurality of passivation layers 310 may also be formed simultaneously on a surface of the planarization layer, inside the perforation region C, away from the substrate; and when the annular isolation columns 210 are obtained, a portion of the planarization layer, inside the perforation region, uncovered by the passivation layer 310 and the planarization layer, inside the perforation region C, partially covered by the passivation layer 310, to form a plurality of film sub-layers 211 between the substrate 100 and the passivation layer 310 (refer to FIG. 6 for the schematic structural diagram). As such, the method is simple and convenient to operate and easy for implementing and manufacturing, and may effectively ensure that film ruptures do not occur easily in the subsequent process procedures.

Figure 7:
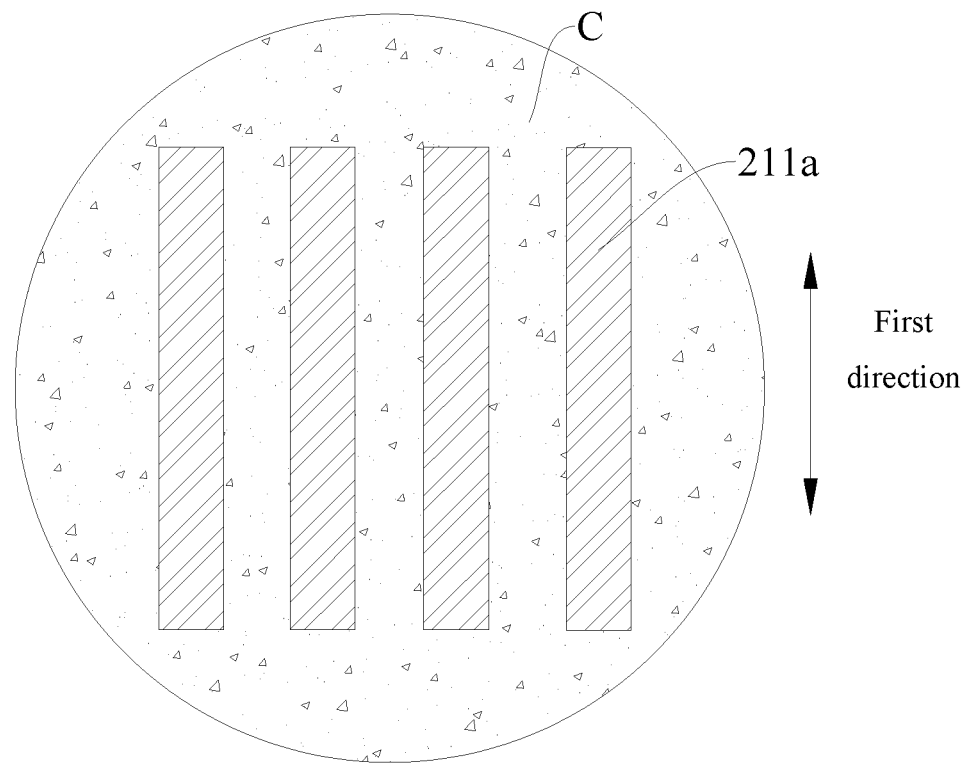
FIG. 7 illustrates a schematic diagram of a planar structure of the film sub-layer in FIG. 6.
Figure 8:
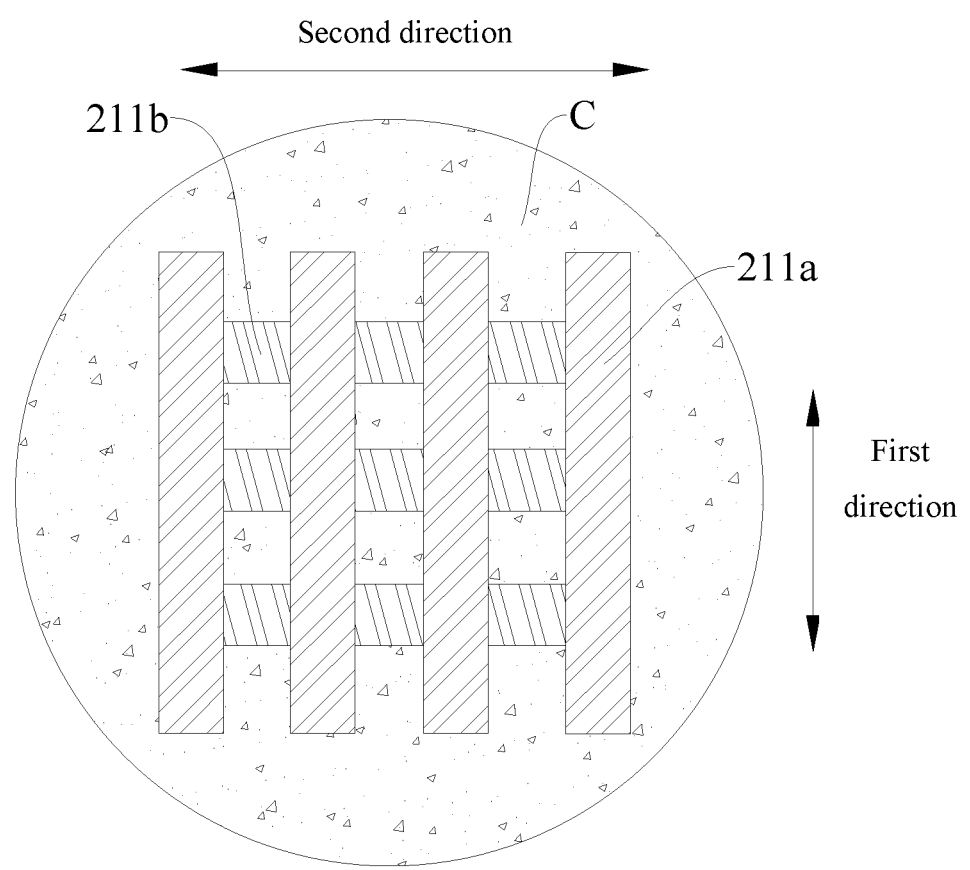
FIG. 8 illustrates a schematic diagram of another planar structure of the film sub-layer in FIG. 6.

According to the embodiment of the present disclosure, specifically, the specific shape of the plurality of film sub-layers 211 is not particularly limited. In some embodiments of the present disclosure, referring to FIG. 7, the plurality of film sub-layers 211 may be strip-shaped, and include a plurality of first film sub-layers 211a spaced apart from each other; and the plurality of first film sub-layers 211a extend along a first direction. Further, in some other embodiments of the present disclosure, referring to FIG. 8, the plurality of film sub-layers may further include a plurality of second film sub-layers 211b, which extend along a second direction different from the first direction; and the plurality of second film sub-layers 211b are disposed spaced apart in the first direction, and disposed between every two adjacent first film sub-layers 211a. As such, the structure is simple and convenient to implement, and may effectively ensure that film ruptures do not occur easily in the subsequent process procedures.

Figure 9:
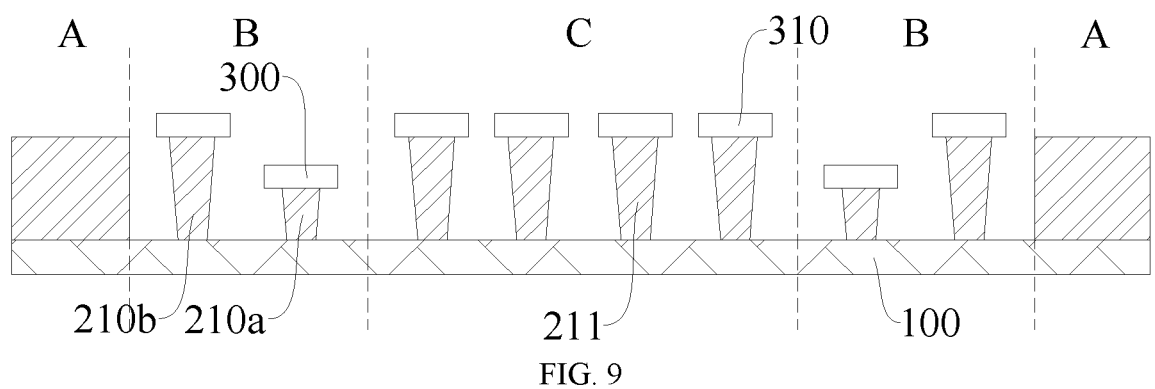
FIG. 9 illustrates a schematic diagram of sectional structures of annular isolating columns and the film sub-layer according to still another embodiment of the present disclosure.

In addition, in some other embodiments of the present disclosure, referring to FIG. 9, the structure described above may also be that: the height of the at least one girdle of annular isolation columns inside the partition region B is different the height of the film sub-layers inside the perforation region C. Specifically, the height of the annular isolation columns 210a close to the edges of the perforation region C may be lower than the height of the film sub-layers 211 inside the perforation region. As such, since the film sub-layers 211 are higher in the perforation region, the bubbles are less likely to be included in the perforation region, so that a film rupture is less likely to occur in the subsequent process procedures. Moreover, the partition region of the manufactured display backplane may further effectively prevent water and oxygen invasion from the outside to further improve the encapsulation effect.

According to the embodiment of the present disclosure, those skilled in the art may understand that, in addition to the structures described previously, the method described in the present disclosure may further include steps such as an overall encapsulating process for the display backplane and a perforating process for the perforation region. Their specific process steps, conditions, and parameters may be the same as the specific process steps, conditions, and parameters in the related art, the details of which will not be repeated herein.

Figure 10:
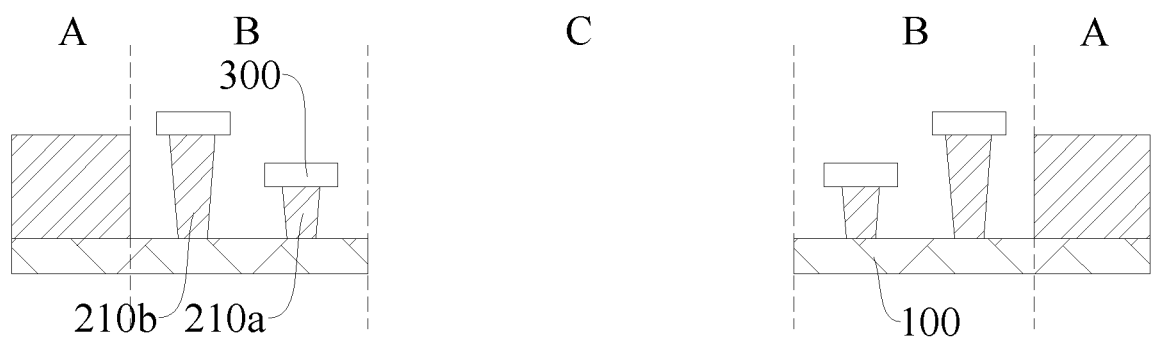
FIG. 10 illustrates a schematic diagram of a sectional structure of a display backplane according to an embodiment of the present disclosure.

According to another aspect of the present disclosure, the present disclosure provides a display backplane. According to the embodiment of the present disclosure, referring to FIG. 10, the display backplane is divided into a pixel region A, a partition region B, and a perforation region C, wherein the partition region B is disposed around the perforation region C, and the pixel region A is disposed around the partition region B. The display backplane includes: a substrate 100; a planarization layer (not indicated in the drawing), which is disposed on one side of the substrate 100 and within the pixel region A; at least two girdles of annular isolation columns 210a and 210b, which are disposed on one side of the substrate 100, located within the partition region B and around the perforation region C and disposed on the same layer as the planarization layer; at least two girdles of annular passivation layers 300, which are disposed on surfaces of the annular isolation columns away from the substrate 100, located inside a portion of partition region B and disposed around the perforation region C; and organic light-emitting elements (not shown in the figure), which are disposed on one side of the planarization layer away from the substrate 100, wherein the height of the annular isolation columns 210a close to the edges of the perforation region is lower than the height of the annular isolation columns 210b close to the edges of the pixel region of the display backplane. As such, during the process of manufacturing the display backplane, film ruptures will not occur easily; and the display backplane has a separation region capable of effectively preventing water and oxygen invasion from the outside, and shows a good encapsulation effect.

According to the embodiment of the present disclosure, the display backplane may further include other necessary structures and components, for example, pixel electrodes and the like. Those skilled in the art may make supplements and designs based on the specific type and operating requirement of the display backplane, the details of which will not be repeated herein.

According to still another aspect of the present disclosure, the present disclosure provides a display device. According to the embodiment of the present disclosure, the display device includes a display backplane manufactured by using the method described previously, or the display backplane described previously. The display device may effectively prevent water and oxygen invasion from the outside to achieve a good encapsulation effect, and has all the features and advantages of the display backplane described previously, the details of which will not be repeated herein.

According to the embodiment of the present disclosure, in addition to the display backplane described previously, the display backplane may further include other necessary structures and components. Those skilled in the art may make supplements and designs based on the specific type and operating requirements of the display device, the details of which will not be repeated herein.

According to the embodiment of the present disclosure, the specific type of the display device is not particularly limited, and includes but is not limited to, for example, a cell phone, a tablet computer, a wearable device, a game player, a television or a vehicle-mounted display, etc.

In the description of the present disclosure, it should be noted that the terms "first" and "second" are merely for descriptive purposes, and cannot be understood as indicating or implying a relative importance or implicitly indicating the number of technical features indicated. As such, the features defined by "first" and "second" may explicitly or implicitly include one or more of said features. In the description of the present disclosure, unless otherwise clearly specified, "a plurality of" means two or more.

In the description of the present specification, the description of reference terms such as "an embodiment", "some embodiments", "example", "specific example", or "some examples" is intended to indicate the inclusion of a specific feature, structure, material, or characteristic as described in combination with the embodiment or example into at least one embodiment or example of the present disclosure. In the present description, the schematic description of the above terms does not necessarily refer to the same embodiment or example. Furthermore, the described particular features, structures, materials, or characteristics can be combined in any one or more embodiments or examples in an appropriate way. In addition, those skilled in the art may incorporate and combine different embodiments or examples and the features of different embodiments or examples as described in the present specification.

Although the embodiments of the present disclosure have been illustrated and described above, it should be understood that the embodiments above are for an exemplary purpose and cannot be understood as limiting the present disclosure. Those skilled in the art may make alternations, modifications, substitutions, and variations to the embodiments above within the scope of the present disclosure.

The invention claimed is:

1. A display backplane, wherein the display backplane is divided into a pixel region, a partition region, and a perforation region; the partition region is disposed around the perforation region; the pixel region is disposed around the partition region; and the display backplane comprises:
   a substrate;
   a planarization layer, which is disposed on one side of the substrate and within the pixel region;
   at least two girdles of annular isolation columns, which are disposed on one side of the substrate, located within the partition region and around the perforation region and disposed on the same layer as the planarization layer;
   at least two girdles of annular passivation layers, which are disposed on surfaces of the annular isolation columns away from the substrate, located at partial regions inside the partition region and disposed around the perforation region;
   a plurality of film sub-layers disposed on one side of the substrate, wherein the film sub-layers are located within the perforation region and disposed on the same layer as the planarization layer;
   a plurality of passivation layers, which are disposed on surfaces of the film sub-layers away from the substrate, and located at the perforation region; and
   organic light-emitting elements, which are disposed on one side of the planarization layer away from the substrate.

2. The display backplane according to claim 1, wherein the height of the annular isolation columns close to edges of the perforation region is lower than the height of the annular isolation columns close to the edges of the pixel region.

3. A method for manufacturing a display backplane, the display backplane is divided into a pixel region, a partition region and a perforation region; the partition region is disposed around the perforation region; the pixel region is disposed around the partition region, wherein the method comprises:
   forming a planarization layer on one side of a substrate inside the pixel region, the partition region, and the perforation region;
   forming at least one girdle of annular passivation layer disposed around the perforation region on a surface, away from the substrate, of the planarization layer inside a portion of the partition layer;
   removing a portion of the planarization layer, inside the partition region, uncovered by the annular passivation layer and the planarization layer, inside the partition region, partially covered by the annular passivation layer, to obtain at least one girdle of annular isolation columns disposed between the substrate and the annular passivation layer and around the perforation region; and
   forming organic light-emitting elements on one side of the planarization layer away from the substrate to obtain the display backplane;
   wherein after forming the planarization layer on one side of the substrate inside the pixel region, the partition region and the perforation region, the method further comprises:
   forming a plurality of passivation layers on a surface of the planarization layer, inside the perforation region, away from the substrate; and when the annular isolation columns are obtained, removing a portion of the planarization layer, inside the perforation region, uncovered by the passivation layer and the planarization layer, inside the perforation region, partially covered by the passivation layer, to form a plurality of film sub-layers between the substrate and the passivation layer.

4. A display device, comprising a display panel manufactured using the method according to claim 3.

5. The method according to claim 3, wherein orthographic projections of the annular isolation columns on the substrate are disposed in a range of an orthographic projection of the annular passivation layer on the substrate.

6. The method according to claim 3, wherein an orthographic projection of the planarization layer, disposed in the perforation region, on the substrate overlaps an orthographic projection of the perforation region on the substrate.

7. The method according to claim 3, wherein the plurality of film sub-layers is strip-shaped, and include a plurality of first film sub-layers spaced apart from each other; and the plurality of first film sub-layers extend along a first direction.

8. The method according to claim 7, wherein the plurality of film sub-layers further comprises a plurality of second film sub-layers, which extend along a second direction different from the first direction; and the plurality of second film sub-layers are disposed spaced apart in the first direction, and disposed between every two adjacent first film sub-layers.

9. The method according to claim 3, wherein the height of the at least one girdle of annular isolation columns inside the partition region is different than the height of the film sub-layers inside the perforation region.

10. The method according to claim 9, wherein the height of the annular isolation columns close to the edges of the perforation region is lower than the height of the film sub-layers inside the perforation region.

11. The method according to claim 3, wherein forming the organic light-emitting elements on one side of the planarization layer away from the substrate comprises:
- forming a preformed film layer on one side of the planarization layer away from the substrate;
- coating photoresist on a surface of the preformed film layer away from the substrate;
- baking, exposing, and developing the photoresist in sequence; and
- etching the preformed layer.

12. The method according to claim 3, wherein the planarization layer is formed through processes of evaporating, depositing, or ink-jet printing.

13. The method according to claim 3, wherein said removing the portion of the planarization layer, inside the partition region, uncovered by the annular passivation layer and the planarization layer, inside the partition region, partially covered by the annular passivation layer comprises:
- etching to remove the portion of the planarization layer, inside the partition region, uncovered by the annular passivation layer and the planarization layer, inside the partition region, partially covered by the annular passivation layer.

14. The method according to claim 3, further comprising:
- integrally encapsulating the display backplane; and
- perforating the perforation region.

* * * * *